United States Patent
Pérez López et al.

(10) Patent No.: US 12,248,180 B2
(45) Date of Patent: Mar. 11, 2025

(54) PHOTONIC CHIP, FIELD PROGRAMMABLE PHOTONIC ARRAY AND PHOTONIC INTEGRATED CIRCUIT

(71) Applicant: UNIVERSITAT POLITÈCNICA DE VALÈNCIA, Valencia (ES)

(72) Inventors: Daniel Pérez López, Valencia (ES); Jose Capmany Francoy, Valencia (ES); Prometheus Dasmahapatra, Valencia (ES)

(73) Assignee: UNIVERSITAT POLITÈCNICA DE VALÈNCIA, Valencia (ES)

( * ) Notice: Subject to any disclaimer, the term of this patent is extended or adjusted under 35 U.S.C. 154(b) by 583 days.

(21) Appl. No.: 17/612,782

(22) PCT Filed: May 11, 2020

(86) PCT No.: PCT/ES2020/070298
§ 371 (c)(1),
(2) Date: Sep. 28, 2022

(87) PCT Pub. No.: WO2020/225471
PCT Pub. Date: Nov. 12, 2020

(65) Prior Publication Data
US 2022/0413222 A1    Dec. 29, 2022

(30) Foreign Application Priority Data
May 9, 2019   (ES) .................................. 201930410

(51) Int. Cl.
*G02B 6/293*   (2006.01)
*G02B 6/12*    (2006.01)
(Continued)

(52) U.S. Cl.
CPC .............. *G02B 6/2935* (2013.01); *G02B 6/12* (2013.01); *G02B 6/28* (2013.01); *G02B 6/43* (2013.01);
(Continued)

(58) Field of Classification Search
CPC .......... G02B 6/2935; G02B 6/12; G02B 6/28; G02B 6/43; H03K 19/14; H03K 19/17736
See application file for complete search history.

(56) References Cited

FOREIGN PATENT DOCUMENTS

| ES | 2694249 A1 | 12/2018 |
| ES | 2695323 A1 | 1/2019 |

OTHER PUBLICATIONS

D. Pérez et al., "Silicon RF-Photonics Processor Reconfigurable Core," 2017 European Conference on Optical Communication (ECOC), Gothenburg, Sweden, 2017, pp. 1-3.*
(Continued)

*Primary Examiner* — Ryan A Lepisto
*Assistant Examiner* — Erin D Chiem
(74) *Attorney, Agent, or Firm* — Hayes Soloway PC

(57) ABSTRACT

The present invention relates to a photonic chip carried out by the combination and interconnection of equally-oriented Programmable Photonics Processing Blocks, with all their longitudinal axes in parallel, implemented over a photonic chip that is capable of implementing one or multiple, simultaneous photonics circuits with optical feedback paths and/or linear multiport transformations, by the appropriate programming of its resources and the selection of its input and output ports. The invention also relates to a parallel field-programmable photonic array (P-FPPA) comprising of, at least one programmable circuit based on equally-oriented/parallel tunable beam-splitters with independent coupling and phase-shifting configuration and peripheral high-performance building blocks.

21 Claims, 7 Drawing Sheets

(51) Int. Cl.
  *G02B 6/28* (2006.01)
  *G02B 6/43* (2006.01)
  *H03K 19/14* (2006.01)
  *H03K 19/17736* (2020.01)

(52) U.S. Cl.
  CPC ....... *H03K 19/14* (2013.01); *H03K 19/17736* (2013.01)

(56) References Cited

OTHER PUBLICATIONS

Masanori Takahashi, "Compact and Low-Lozz Zro2—SiO2 PLC-Based 8×8 Multicast Switch for CDC-ROADM Application", Journal, 2016, 1712-1716, vol. 34, No. 8, Journal of Lightwave Technology.

Daniel Perez, "Silicon RF-Photonics Processor Reconfiguration Core", Symposium, 2017, 1-3, 2017 European Conference on Optical Communication.

Daniel Perez, "Reconfigurable Lattice Mesh Designs for Programmable Photonic Processors and Universal Couplers", Symposium, 2016, 1-4, 2016 18th International Conference on Transparent Optical Networks.

* cited by examiner

PHOTONIC CHIP, FIELD PROGRAMMABLE PHOTONIC ARRAY AND PHOTONIC INTEGRATED CIRCUIT

CROSS-REFERENCE TO RELATED APPLICATIONS AND PRIORITY

This patent application claims priority from PCT Application No. PCT/ES2020/070298 filed May 11, 2020, which claims priority from Spanish Patent Application No. P201930410 filed May 9, 2019. Each of these patent applications are herein incorporated by reference in their entirety.

OBJECT OF THE INVENTION

The present invention relates to a photonic chip carried out by the combination and interconnection of equally-oriented Programmable Photonics Processing Blocks, with all their longitudinal axes in parallel, implemented over a photonic chip that is capable of implementing one or multiple simultaneous photonics circuits with optical feedback paths and/or linear multiport transformations by the appropriate programming of its resources and the selection of its input and output ports. The invention also relates to a Parallel-field-programmable photonic array (P-FPPA) comprising at least a programmable circuit based on equally-oriented tunable beamsplitters with independent coupling and phase-shifting configuration and peripheral high-performance building blocks.

BACKGROUND OF THE INVENTION

Programmable multifunctional photonics (PMP) seeks to design common configurations of integrated optical hardware that can implement a wide variety of functionalities by means of suitable programming. Various authors have covered theoretical works proposing different configurations and design principles for programmable circuits based on cascade beam splitters or Mach-Zehnder interferometers (MZIs). These proposals offer versatile hardware solutions to implement programmable circuits, but none of them defines a complete architectonic solution for a photonic device that can be programmed to implement simple, complex or even simultaneous arbitrary circuits.

Additionally, it has been proved that the combination of optical processing units with the capability of programming/tuning/selecting the splitting ratio between their ports and the phase response has lead to waveguide mesh arrangements with different mesh topologies and ground-breaking versatility in regards to their functionality. In particular, some of the proposed topologies enable feedback-loops inside the arrangements allowing the formation of optical cavities, Sagnac-type loops and more complex circuit topologies. However, the proposed architectures are based on the combination of tunable basic units (TBUs) that have different component spatial/angular orientation. This means that the longitudinal axes of the TBUs are not parallel between them. For example, the square topology is based on horizontal (0°-TBUs) and 90°-TBUs; the triangular topology is based on 0°-TBU, 60°-TBU and −60° TBUs; the hexagonal topology is based on 0°-TBUs, 30°-TBU, −30°-TBUs and this is maintained for arbitrary uniform and non-uniform topologies. This imposes several practical restrictions: first, the footprint is relatively large for most of the proposed topologies, limiting the integration density and thus the scalability of the circuits. This fact is exacerbated for large TBUs. Secondly, some photonic components are sensitive to orientation due to their intrinsic material, fabrication and waveguide geometry properties. For example, some phase actuators require a certain component orientation, in order for the physical realization of the device to be possible and to achieve a reasonable tuning efficiency along with it. Employing current approaches, only phase tuners that support arbitrary component orientation can be employed. Moreover, some TBUs employ 3-dB couplers (directional couplers or multimode interferometers), which are also sensitive to orientation, limiting the overall circuit performance.

DESCRIPTION OF THE INVENTION

The object of the invention described here solves the problems set out above and allows the design of programmable waveguide mesh arrangements where all the said processing components have the same spatial/angular orientation i.e. a configuration where all TBUs are parallel to each other, thus providing a clear technical advantage to current approaches in term of ease of fabrication, performance and footprint. This means that the longitudinal axis of each TBUs are in parallel.

The object of the invention is based on the replication and interconnection of units of equally oriented programmable photonic analog blocks and reconfigurable interconnections preferably implemented via a photonic chip. These components provide the basic building blocks to implement basic optical analog operations (reconfigurable optical power and energy division as well as independent phase shifting). In a very broad sense, it can be considered that reconfigurable processing, in the same manner as the programmable logical blocks (PLB) carry out digital operations in electronic FPGAs or configurable analogue blocks (CBAs), which carry out analogue operations in electronic field-programmable analogue arrays (FPAA). Therefore, and in view of the foregoing, it can be observed that the object of the invention allows one or various simultaneous photonic circuits and/or linear multiport transformations by means of suitable programming of their resources, that is to say the corresponding Programmable Photonic Analogue Block and the selection of their input and output ports, while maintaining the same spatial/angular orientation in all the Programmable Photonic Analogue Blocks. Thus, the essential contribution of the invention is the interconnection schemes that allow the designer to maintain the PPABs orientation.

The object of the invention is described in the set of claims, hereby included by reference.

The proposed photonic chip, equally-oriented field-programmable photonic array (P-FPPA) of the present invention brings a series of advantages inherent to field programmable hardware approaches, expanded by the circuit topologies introduced by the invention. These include:

Shorter times for production and to market.
Lower prototype development and non-recurring engineering costs.
Reduced financial risk in developing ideas and translating them into ASPICs.
Multifunctional and multitask operation.
Circuit optimization.
Regular layouts and reduced footprints.
Better yield and reproducibility of the Programmable Photonic Analogue Blocks.
Larger number of alternative circuit topologies not constrained by geometrical factors.

The proposed photonic chip, equally-oriented field-programmable photonic array (P-FPPA) of the present invention is suitable for the following applications:
- Aerospace and Defense (Avionics, Communications, Secure Solutions, Space)
- Automotive (High Resolution Video, Image Processing Vehicle Networking and Connectivity, Automotive Infotainment)
- Data Centers (Servers, Routers, Switches, Gateways)
- High Performance Computing (Servers, Super Computers, SIGINT Systems, High-end RADARs, High-end Beam Forming Systems, Quantum computing, High-speed neural networks)
- Integrated Circuit Design (ASPIC Prototyping, Hardware Emulation)
- Wired and Wireless Communications (Optical Transport Networks, Network Processing 5G Connectivity Interfaces, Mobile Backhaul)
- Hardware accelerators.
- Machine and Deep learning applications.

DESCRIPTION OF THE DRAWINGS

In order to complement the description being made and with the object of helping to better understand the characteristics of the invention, in accordance with a preferred practical embodiment thereof, said description is accompanied, as an integral part thereof, by a set of figures where, in an illustrative and non-limiting manner, the following has been represented.

PREFERRED EMBODIMENT OF THE INVENTION

Figure 1:
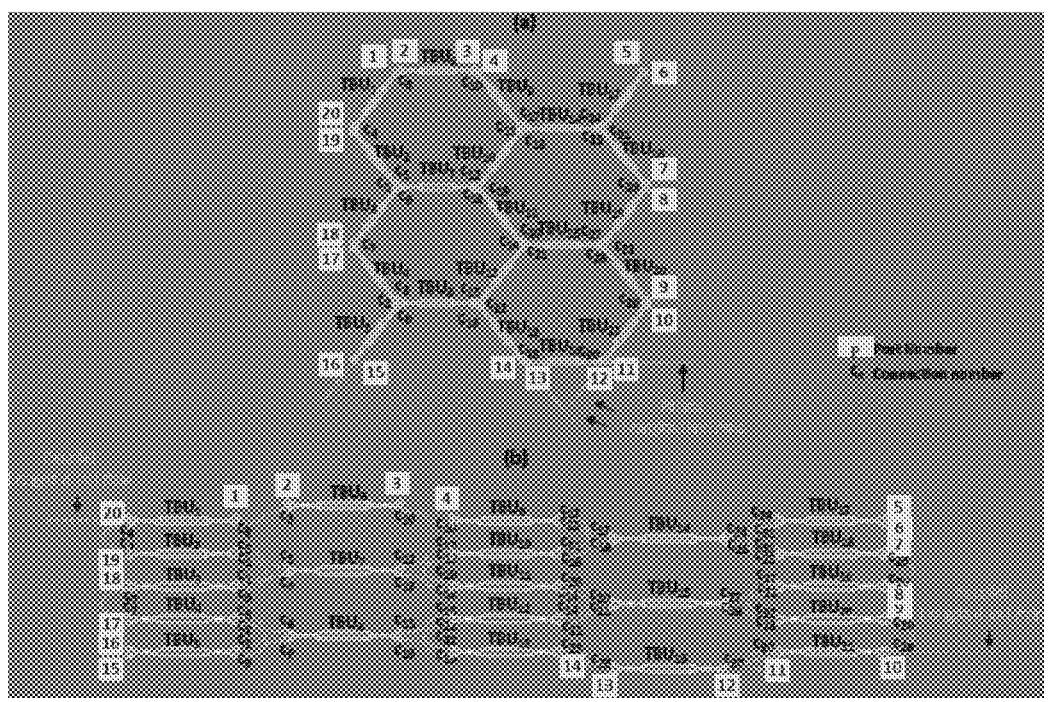
FIG. 1 shows some non-limitative examples of a schematic diagram example of the proposed photonic chip of the invention, wherein the illustration shows a detail of the internal signal coupling layout interconnection of Equally-oriented Programmable Photonic Analog Blocks or Tunable Basic Units (TBUs) and following a uniform pattern. (Up: Conventional hexagonal uniform waveguide mesh distribution according to the state of the art, Down: proposed equally-oriented layout of the present invention.
Figure 2:
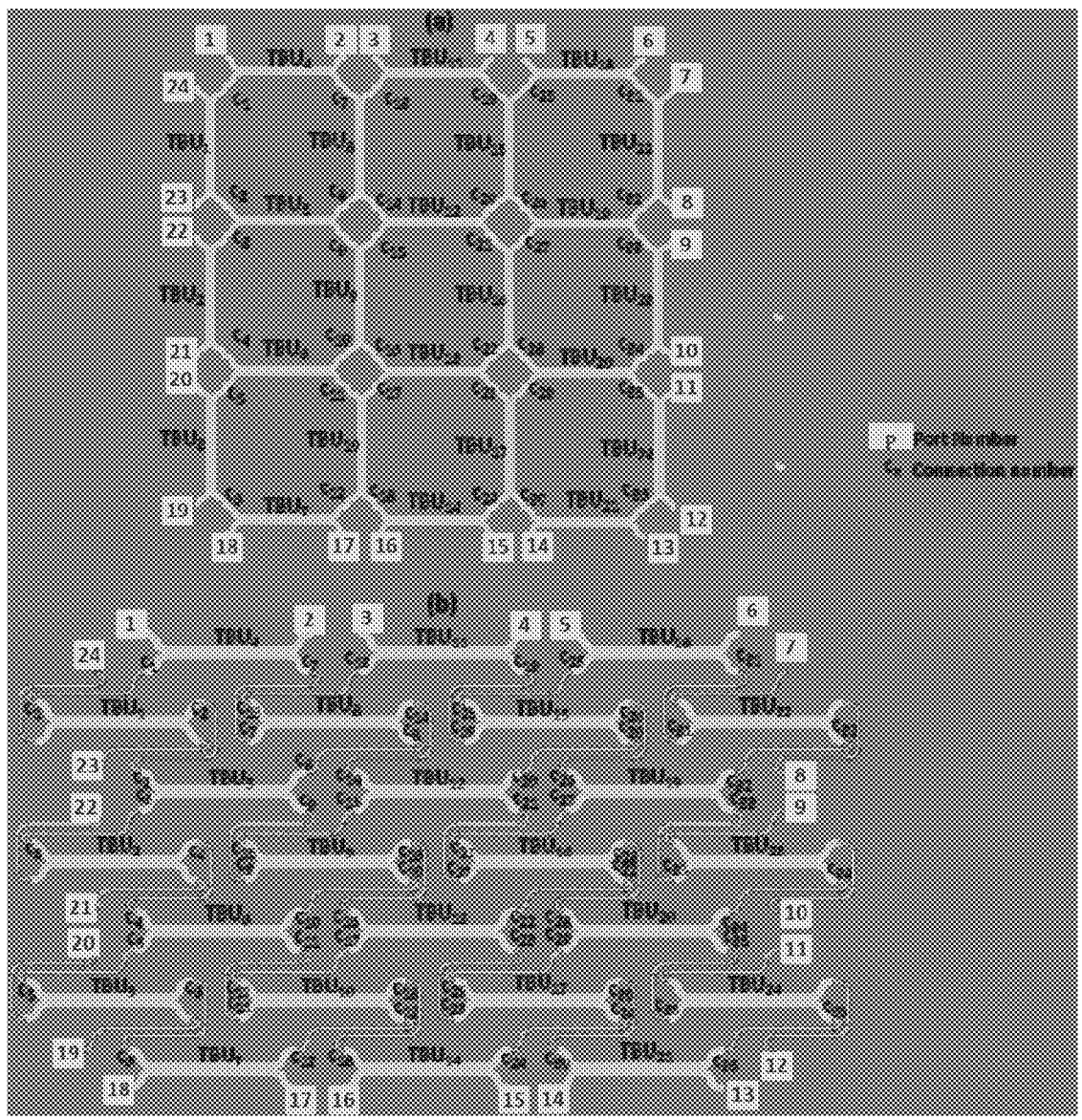
FIG. 2 shows some non-limitative examples of a schematic diagram example of the proposed photonic chip of the invention, wherein the illustration shows a detail of the internal signal coupling layout interconnection of Equally-oriented Programmable Photonic Analog Blocks and following a uniform pattern. (Up: Conventional square uniform waveguide mesh distribution according to the state of the art, Down: proposed equally-oriented layout of the present invention.
Figure 3:
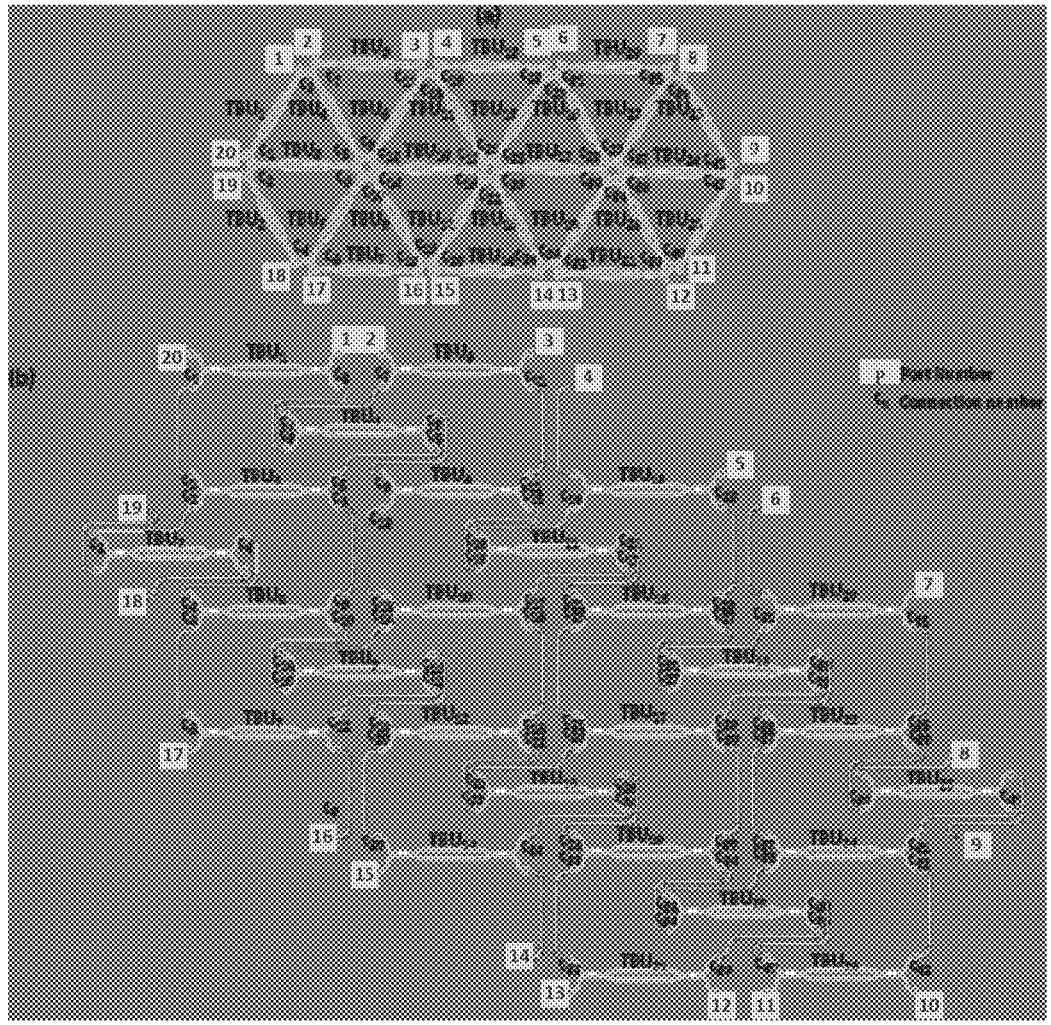
FIG. 3 shows some non-limitative examples of a schematic diagram example of the proposed photonic chip of the invention, wherein the illustration shows a detail of the internal signal coupling layout interconnection of Equally-oriented Programmable Photonic Analog Blocks and following a uniform pattern. (Up: Conventional triangular uniform waveguide mesh distribution according to the state of the art, Down: proposed equally-oriented layout of the present invention.
Figure 4:
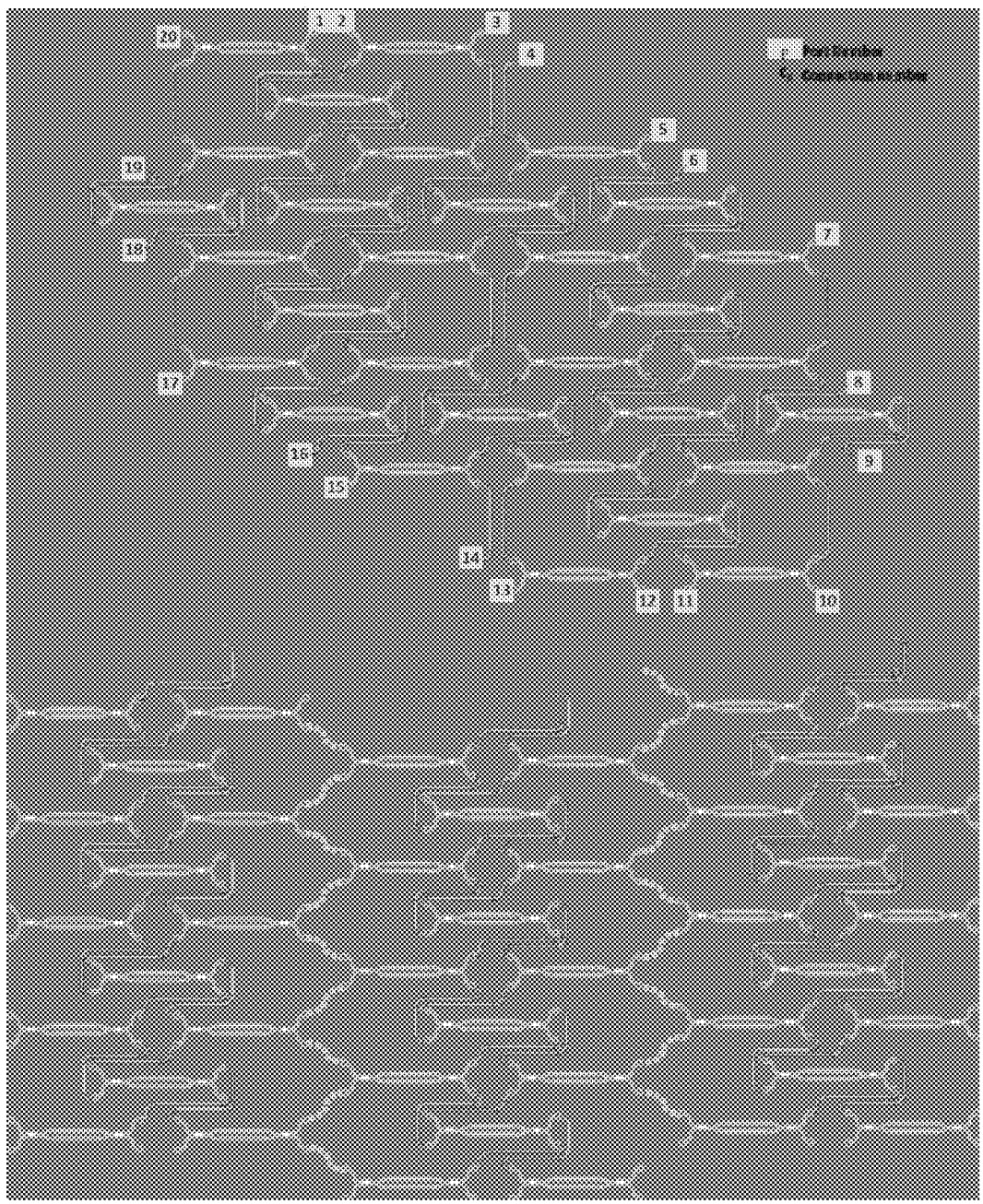
FIG. 4 shows some non-limitative examples of a schematic diagram example of the proposed photonic chip of the invention, wherein the illustration shows a detail of the internal signal coupling layout interconnection of Equally-oriented Programmable Photonic Analog Blocks and following a non-uniform pattern.

In a preferred embodiment of the object of the invention, a device is provided as shown in FIG. 1 where a field-programmable photonic array (P-FPPA) is seen which comprises at least one, but preferably a large number of equally-oriented programmable photonic analogue blocks (PPAB) implemented by way of a series of photonic waveguide elements developed on a photonic chip substrate. These blocks have programmable characteristics and can propagate the light in both directions. Take into account that the design in FIG. 1 does not assume any particular interconnection geometry and that the resulting design shown there is only for the purposes of illustration. Although various configurations for the PPBA may be considered, here it is illustrated the design with a very basic 4-port PPBA units. The scheme of said equally-oriented PPAB and their interconnections are shown in the square of FIG. 1 for a particular axis orientation and without internal coupling routes. In general, different options will be considered, wherein all PPAB blocks will remain in the same orientation. FIG. 1-4 shows some of the possible interconnection options. The function of the PPAB is to provide independent power coupling relations and adjustable phase adjustments, as explained below.

The PPAB is a 2×2 photonic component capable of independently configuring a common tunable phase shift $\Delta_{PPAB}$ and tunable optical power splitting ratio $K=\sin\square$ ($0<=K<=1$) between its optical waveguide input fields and its output optical waveguide output fields.

Figure 5:
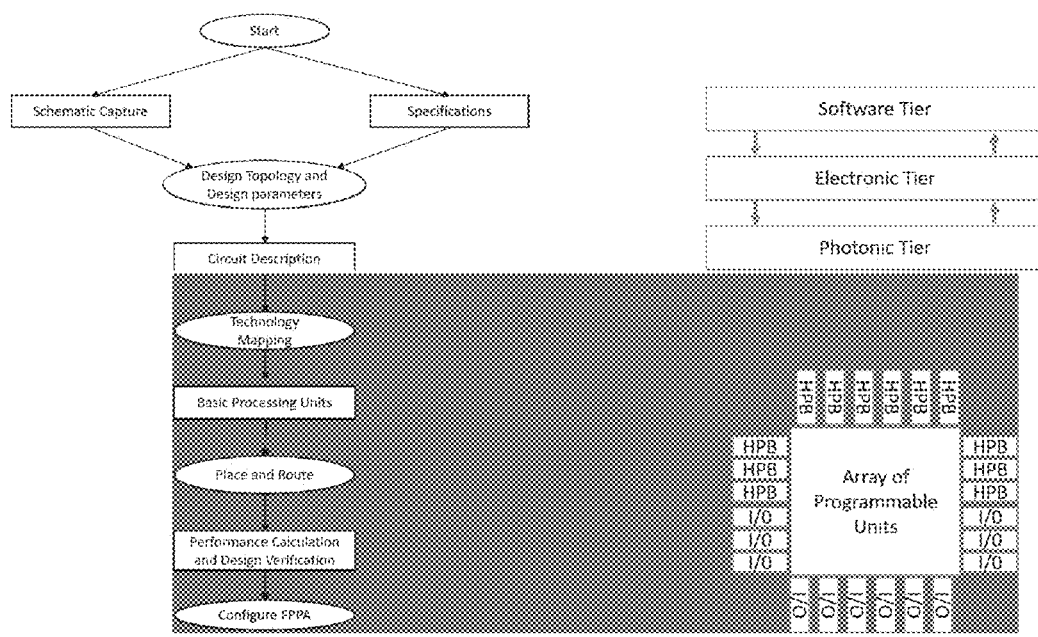
FIG. 5 shows on the left-hand, the main steps involved in the design/configuration flow of a photonic chip of the present invention and on the right-hand, the soft and hard tiers of the photonic chip and the expanded layout including peripheral high-performance blocks.

FIG. 5 shows some examples of the simple programming of the RPI+PPAB which leads to very basic operations required in the processing of photonic signals. Many more are possible.

By means of suitable programming and the concatenation of successive equally-oriented processing blocks, the P-FPPA can implement complex autonomous and/or parallel photonic circuits and signal processing transformations by discretizing conventional optical processing circuits into RPI and PPAB units.

In particular, this concept is illustrated by means of three generic designs, which are represented in FIG. 5, respectively.

The parallel field-programmable photonic array (P-FPPA) according to the invention is an array of equally-oriented uncommitted elements that can be interconnected according to the user's specifications configured for a wide variety of applications. An P-FPPA combines the programmability of the most basic reconfigurable photonic integrated circuits in a scalable interconnection structure, allowing programmable circuits with much higher processing density. Thus, processing complexity comes from the interconnectivity. In addition, it solves the problems related to previous waveguide meshes where the interconnection topology was constrained by the resulting TBU orientations. Our proposed invention solves them several problems: first, the footprint is reduced considerably, reducing the limit of the integration density and thus the versatility of the circuits. Secondly, some photonic components are sensitive to orientation due to their intrinsic material and waveguide geometry properties. For example, some phase actuators require a certain component orientation, in order to maintain a reasonable tuning efficiency. With current approaches, only phase-change effects that support arbitrary component orientation can be employed. Moreover, some TBUs employ 3-dB couplers (directional couplers or multimode interferometers), which are also sensitive to orientation, limiting the overall circuit performance. With the proposed invention, both the processing performance and the circuit reproducibility and reliability are improved. It is also an object of the present invention a photonic integrated circuit comprising of programmable tunable couplers for the interconnection of at least two equally-oriented programmable photonic elements as described in the previous paragraph that uses the programmable tunable couplers as their primitive element to configure interferometric structures.

Preferably, the equally-oriented programmable tunable couplers are interconnectable in such a way that they allow the configuration of optical cavities, optical loops, and both feed-forward and feed-backward interferometric structures using the tunable couplers with additional phase configuration as their primitive element.

Also preferably, the photonic integrated circuit is interconnected to high-performance building blocks configured to perform basic optical processing tasks such as: optical amplification, optical sources, electro-optical modulation, opto-electronic photodetection, optical absorption, variable optical attenuators, non-linear processing elements and delay line arrays, optical wavelength, spatial, modal and polarization (de)multiplexing, optical routing. In this case, in the photonic integrated circuit, the waveguide mesh arrangement is connected to an electrical subsystem driving the actuators or to on-chip actuators/receivers, to an electrical subsystem monitoring the optoelectronic read-outs and to a microprocessor that run the optimization and configuration programs.

The photonic integrated circuit may further comprise equally-oriented primitive components implemented by a non-resonant Mach-Zehnder Interferometer, or equally-oriented primitive components implemented by a non-resonant Mach-Zehnder Interferometer with two arms of equal length, or equally-oriented primitive components implemented by a resonant interferometer, or equally-oriented primitive components implemented by a dual-drive directional coupler, or equally-oriented primitive components with an arbitrary number of ports, or equally-oriented primitive components implemented where the phase and amplitude tuners are based on: Nano Electro Mechanical Systems (NEMS), and Micro-Electro Mechanical Systems (MEMS), thermo-optic effects, electro-optic effects, opto-mechanics, electro-absorption, electro-capacitive effects, electro-inductive effects, memristor elements or non-volatile phase actuators.

In the integrated circuit, the equally-oriented waveguide mesh arrangements of PPABs are distributed in a non-uniform topology, or the equally-oriented waveguide mesh arrangements of PPABs interconnections maintain the same length between all nodes, or the equally-oriented waveguide mesh arrangements of PPABs interconnections maintain arbitrary lengths between all nodes.

Figure 6:
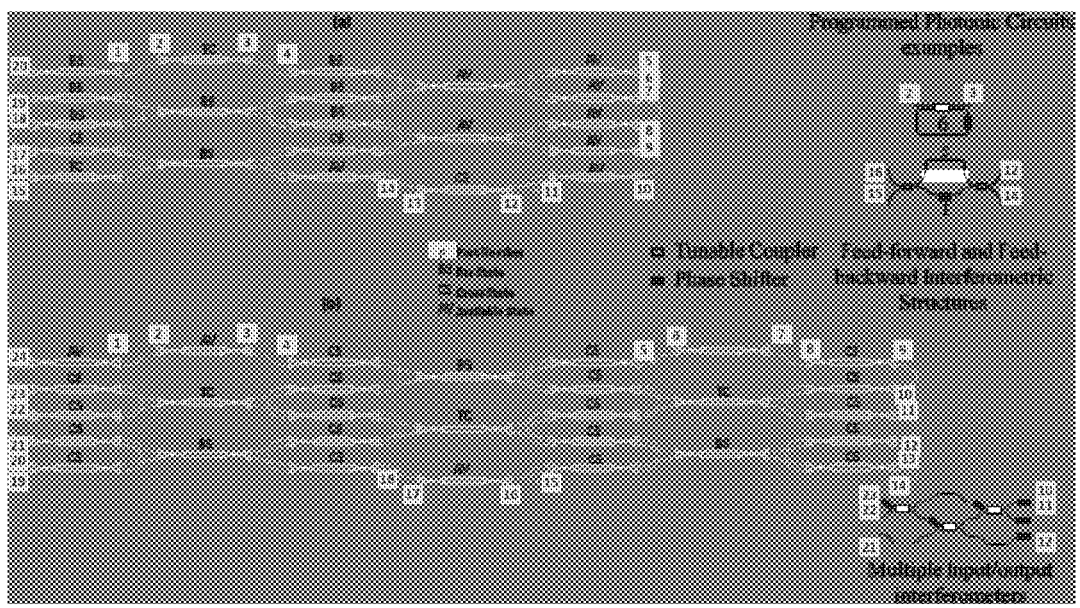
FIG. 6 shows a simultaneous implementation of a Ring cavity, a balanced Mach-Zehnder Interferometer and a 3×3 multiple port interferometer using a design of the photonic chip of the present invention where all the processing units are equally-oriented.

The left part of FIG. 6 shows the main steps of the design flow process, which is now described. The starting point for the design flow is the initial application entry to be implemented. The specifications are then processed by an optimization procedure to enhance the area and performance of the final circuit. Then, specifications are transformed into a compatible circuit of FPPA processing blocks (technology mapping), optimizing attributes such as delay, performance or number of blocks.

Technology mapping phase transforms the optimized network into a circuit that consists of a restricted set of circuit elements (P-FPPA processing blocks). This is done selecting parts of the network that can each be implemented by one of the available basic circuit elements, and then specifying how these elements will be interconnected. This will determine the total number of processing blocks required for the targeted implementation.

Then, a decision about the placement follows, assigning each processing block to a specific location in the P-FPPA. At that moment, the global routing is done choosing the processing units that will operate as access lightpaths. In contrast to FPGA, this structure does not physically differentiate between processing blocks and Interconnection resources. Formerly, the processing block configurations are chosen correspondingly and performance calculation and design verification are carried out. It can be done either physically by feeding all the necessary configuration data to the programming units to configure the final chip or by employing accurate models of the P-FPPA. At each step it is possible to run an optimization process that might decide to re-configure any of the previous steps. Preferably, the programmable photonic analogue block (PPAB) comprises at least two input ports and at least two output ports and is described by at least a unitary 2×2 rotation matrix of the special unitary group with different phase relationships among its four components.

From the aforementioned description it can be appreciated that the P-FPPA involves not only the physical hardware of the photonic and control electronic tier but also it is composed of a software layer (see upper right part of FIG. 5).

The steps contained in the generic design flow can be done automatically by the software layer, by the user, or a mixture of the two, depending on the autonomy and the capabilities of the P-FPPA. In addition, a failure in any of the steps will require an iterative process till the specifications are accomplished successfully. Additional parallel optimization process (mainly self-winding), enable robust operation, self-healing attributes and additional processing power to the physical device.

Similarly to modern FPGA families, FPPA can include peripheral and internal high-performance blocks (HPB) to expand its capabilities to include higher level functionality fixed into the chip. This is shown schematically in the lower right part of FIG. 5. Having these common functions embedded into the chip reduces the area required and gives those functions increased performance compared to building them from primitives. Moreover, some of them are impossible to be obtained by a discretized version of basic processing blocks. Examples of these include high-dispersive elements, spiral waveguide delay lines, generic modulation and photo detection subsystems, optical amplifiers and source subsystems and high-performance filtering structures to cite a few.

Figure 7:
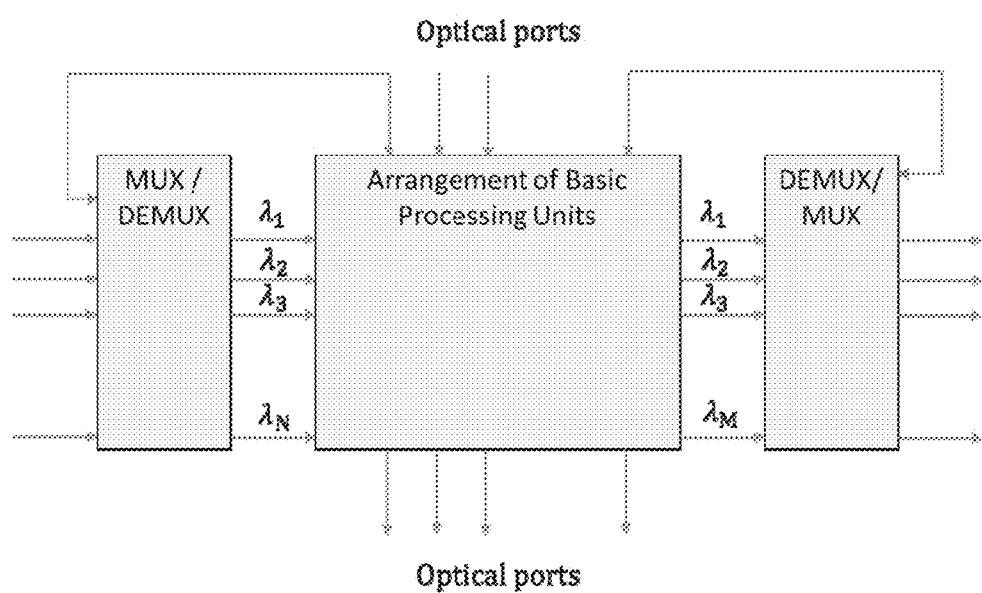
FIG. 7 shows an FPPA implementation with high-performance building blocks providing wavelength multiplexing and demultiplexing tasks. The arrangement of basic processing units can be coupled to this block enabling the processing in different channels and different wavelengths.

A special case of HPB is an interconnection of the arrangement of basic processing units with input/output wavelength multiplexing/demultiplexing devices, either of which can be spectrally cyclic, or non-cyclic. As illustrated in FIG. 7, it introduces another degree of flexibility, allowing the processing of multiple wavelengths. It shows that the system enables the processing on different spatial channels/modes as well as different frequency channels/modes.

In addition, the P-FPPA can incorporate multiple and independent processing cores that can be interconnected among them and to high-performance building blocks to increase the processing performance. This processing cores of waveguide meshes can be integrated in the same substrate or can be integrated in different dies.

Operation Examples

FIG. 6 provide some examples where FPPA of different types are programmed to emulate and implement simultaneously different photonic circuits. In each case the figure includes the FPPA layout with colored processing units according to the code defined earlier and the layouts of the implemented circuits.

Physical Implementation

The physical implementation of the P-FPPA device calls for an integrated optics approach either based on silicon photonics platform or a hybrid/heterogeneous III-V and Silicon photonics platforms.

As for the PPAB elements, the currently available photonics technology options are based on any phase tuning effect like: MEMS, thermo-optic effects, electro-optic effects, opto-mechanics, electro-capacitive effects or non-volatile phase actuators. This phase shifter actuators are integrated in any interferometric structure with more than two ports. Finally, as mentioned before, more complex FPPFA layouts can be designed by setting different interconnections schemes among the equally-oriented processing blocks some examples are shown in the lower part of FIGS. 1-4.

The invention claimed is:

1. A photonic chip, comprising:
    at least two programmable photonic analog blocks (PPABs), and
    interconnections between the at least two programmable photonic analog blocks (PPABs),
        being implemented via a photonic chip,
    wherein the at least two programmable photonic analog blocks (PPABs) have the same orientation, and are parallel to each other, and
    wherein the interconnections between the at least two programmable photonic analog blocks (PPABs) comprise equally-oriented, programmable, reconfigurable tunable couplers, and
    wherein the at least two programmable photonic analog blocks (PPABs) interconnected by the equally-oriented programmable tunable couplers are configured to maintain their orientation while the equally-oriented, programmable, reconfigurable tunable couplers are reconfigured.

2. The photonic chip of claim 1, wherein each one of the at least two programmable photonic analog blocks (PPABs) comprises a longitudinal axis, wherein the longitudinal axes of the at least two programmable photonic analog blocks (PPABs) are parallel.

3. The photonic chip of claim 1, wherein the programmable photonic analog block (PPAB) comprises of at least two photonic waveguide elements.

4. The photonic chip of claim 3, wherein the photonic waveguide element is configured to allow propagation in both directions.

5. The photonic chip of claim 1, wherein the programmable photonic analogue block (PPAB) comprises at least two input ports and at least two output ports and is described by at least a unitary 2×2 rotation matrix of the special unitary group with different phase relationships among components of the matrix.

6. The photonic chip of claim 1, wherein the PPABs are configured to set an arbitrary splitting ratio K ($0<=K<=1$) as well as set a common phase shift $\Delta_{PPAB}$ between at least one input port and at least one output ports.

7. The photonic chip of claim 1, wherein at least two equally-oriented programmable photonic analog blocks (PPABs) are configured by a series of photonic waveguide elements developed on a photonic chip.

8. A photonic integrated circuit comprising the photonic chip of claim 1, wherein the photonic chip is interconnected to high-performance building blocks configured to perform basic optical processing tasks comprising at least one of the following: optical amplification, optical sources, electro-optical modulation, opto-electronic photodetection, optical absorption, variable optical attenuators, non-linear processing elements and delay line arrays, optical wavelength, spatial, modal and polarization (de) multiplexing, optical routing.

9. The photonic integrated circuit of claim 8, further comprising high-performance building blocks configured to perform spatial division wavelength multiplexing/demultiplexing of light, either in a cyclic or non-cyclic way.

10. The photonic integrated circuit of claim 8, being the equally-oriented, programmable, reconfigurable tunable couplers implemented by a non-resonant Mach-Zehnder Interferometer.

11. The photonic integrated circuit of claim 8, being the equally-oriented, programmable, reconfigurable tunable couplers implemented by a non-resonant Mach-Zehnder Interferometer with two arms of equal length.

12. The photonic integrated circuit of claim 8, being the equally-oriented, programmable, reconfigurable tunable couplers implemented by a resonant interferometer.

13. The photonic integrated circuit of claim 8, being the equally-oriented, programmable, reconfigurable tunable couplers implemented by a dual-drive directional coupler.

14. The photonic integrated circuit of claim 8, being the equally-oriented, programmable, reconfigurable tunable couplers with an arbitrary number of ports.

15. The photonic integrated circuit of claim 8, being the equally-oriented, programmable, reconfigurable tunable couplers implemented where the phase and amplitude tuners are based on: Nano Electro Mechanical Systems (NEMS), and Micro-Electro Mechanical Systems (MEMS), thermo-optic effects, electro-optic effects, opto-mechanics, electro-absorption, electro-capacitive effects, electro-inductive effects, memristor elements or non-volatile phase actuators.

16. The photonic integrated circuit of claim 8, wherein the equally-oriented waveguide mesh arrangements of PPABs interconnections comprise nodes wherein the equally-oriented waveguide mesh arrangements of PPABs interconnections maintain the same length between all nodes.

17. The photonic integrated circuit of claim 8, wherein the equally-oriented waveguide mesh arrangements of PPABs interconnections comprise nodes wherein the equally-oriented waveguide mesh arrangements of PPABs interconnections maintain arbitrary lengths between all nodes.

18. The photonic integrated circuit of claim 8, wherein at least two equally-oriented waveguide mesh arrangements are interconnected between them enabling a multi-stage or multicore platform.

19. The photonic integrated circuit of claim 8, wherein the waveguide mesh arrangement is connected to an electrical subsystem driving actuators or to on-chip actuators/receivers, to an electrical subsystem monitoring optoelectronic read-outs and to a microprocessor that run optimization and configuration programs.

20. The photonic integrated circuit of claim 1, wherein the equally-oriented waveguide mesh arrangements of PPABs are distributed in a uniform topology.

21. The photonic integrated circuit of claim 1, wherein the equally-oriented waveguide mesh arrangements of PPABs are distributed in a non-uniform topology.

\* \* \* \* \*